United States Patent
Imamura

(10) Patent No.: US 9,165,093 B2
(45) Date of Patent: Oct. 20, 2015

(54) SIMULATION METHOD FOR TIRE

(71) Applicant: SUMITOMO RUBBER INDUSTRIES, LTD., Kobe-shi, Hyogo (JP)

(72) Inventor: Ao Imamura, Kobe (JP)

(73) Assignee: SUMITOMO RUBBER INDUSTRIES, LTD., Kobe-Shi (JP)

( * ) Notice: Subject to any disclaimer, the term of this patent is extended or adjusted under 35 U.S.C. 154(b) by 0 days.

(21) Appl. No.: 13/828,967

(22) Filed: Mar. 14, 2013

(65) Prior Publication Data
US 2013/0275104 A1 Oct. 17, 2013

(30) Foreign Application Priority Data
Apr. 11, 2012 (JP) ................................ 2012-090403

(51) Int. Cl.
G06F 17/50 (2006.01)
B60W 40/12 (2012.01)
B60C 99/00 (2006.01)
B60C 5/00 (2006.01)

(52) U.S. Cl.
CPC .......... *G06F 17/5009* (2013.01); *B60C 99/006* (2013.01); *B60W 40/12* (2013.01); *G06F 17/50* (2013.01); *G06F 17/5095* (2013.01); *G06F 17/5018* (2013.01)

(58) Field of Classification Search
None
See application file for complete search history.

(56) References Cited

U.S. PATENT DOCUMENTS

| | | | |
|---|---|---|---|
| 6,430,993 B1* | 8/2002 | Seta | 73/146 |
| 2002/0035456 A1* | 3/2002 | Cremers et al. | 703/5 |
| 2002/0134149 A1* | 9/2002 | Shiraishi et al. | 73/146 |
| 2003/0055617 A1* | 3/2003 | Iwasaki et al. | 703/2 |
| 2004/0107081 A1* | 6/2004 | Miyori et al. | 703/6 |
| 2009/0165908 A1* | 7/2009 | Takahashi et al. | 152/209.18 |
| 2010/0299107 A1* | 11/2010 | Umayahara et al. | 703/1 |
| 2010/0305746 A1* | 12/2010 | Shiraishi | 700/199 |
| 2011/0301929 A1* | 12/2011 | Huang et al. | 703/7 |

OTHER PUBLICATIONS

Brinkmeier, M., et al, "A finite element approach for the simulation of tire rolling noise," Journal of Sound and Vibration, vol. 209, (2008), pp. 20-39.*
Y. Waki, et al., "Free and Forced Vibrations of a Tyre Using a Wave/Finite Element Approach," Journal of Sound and Vibration, vol. 323, 2009, pp. 737-756.*

* cited by examiner

*Primary Examiner* — Aniss Chad
*Assistant Examiner* — David M Rogers
(74) *Attorney, Agent, or Firm* — Birch, Stewart, Kolasch & Birch, LLP

(57) ABSTRACT

A computerized simulation method for evaluating a tire performance is disclosed. Firstly, a simulation of a rolling tire is made by contacting a tire model with a road surface model, and chronological data about node points of the tire model which node points appear in the outer surface of the tire model during rotating are stored. Then, a domain of a fluid is defined, and a simulation of the fluid is made by the use of the chronological data, wherein a small gap is formed between the tire model and the road surface model, and the fluid domain is also defined in the gap.

6 Claims, 16 Drawing Sheets

(a)

(b)

SIMULATION METHOD FOR TIRE

BACKGROUND OF THE INVENTION

The present invention relates to a computerized simulation method for a tire capable of evaluating performances of the tire relating to fluid such as air and water and capable of greatly reducing the computational time.

In recent years, a computerized simulation method for evaluating noise performance of a tire has been proposed in U.S. Patent Application Publication No. U.S. 2010-0305746 A1.

In this method, during a tire model is rolling on a road surface model, physical quantities of air surrounding the tire model are computed to evaluate the noise performance of the tire.

In this method, during computing namely rolling, the fluid domain where the air is defined has to be changed according to the change in the shape of the ground contacting area of the tread of the tire model. Therefore, the shape and position of the ground contacting area of the tire model have to be computed in steps of a minute unit time, and then the fluid domain has to be defined according thereto, and then the fluid domain has to be computed for the physical quantities. Accordingly, a very long computational time is required to obtain the physical quantities.

SUMMARY OF THE INVENTION

It is therefore, an object of the present invention to provide a computerized simulation method for a tire capable of evaluating performances of the tire relating to fluid such as air and water and capable of greatly reducing the computational time.

According to the present invention, a computerized simulation method for evaluating a performance of a tire provided in its tread surface with a groove, comprises:

a step in which a tire model which is a finite element model of the tire is generated, wherein the tire model has a tread portion provided with the tread surface and the groove;

a step in which a road surface model which is a finite element model of a road surface is generated;

a rolling simulation step in which the tire model is brought into contact with the road surface model, and rotation of the tire model is computed;

a step in which, based on computational results obtained in the rolling simulation step, chronological data about node points of the tire model which node points appear in the outer surface of the tire model during rotating are stored;

a step in which, the outer surface of the tire model specified by the stored chronological data, the road surface model, and a fluid domain surrounding at least a part of the outer surface of the tire model and at least a part of the road surface model, are defined, and a fluid is defined in the fluid domain; and a fluid simulation step in which, physical quantities of the fluid in the fluid domain are computed by rotating the outer surface of the tire model using the stored chronological data, wherein the fluid simulation step includes a step in which at least a ground contacting area of the outer surface of the tire model is separated from the road surface model by a small distance so as to form a small gap between the tire model and the road surface model, and a step in which the fluid domain is defined in the gap.

In the case that the performance to be evaluated is noise performance of the tire, the fluid is air, and a pressure change of the air is computed. The small gap is preferably 0.01 mm or more. The fluid domain is divided into a finite number of elements, and the elements in the gap are two or more layered. Preferably, the elements of the fluid domain each have an aspect ratio of not more than 100, wherein the aspect ratio is a ratio of the size measured in the tire circumferential direction to the size measured in the tire radial direction.

DESCRIPTION OF THE PREFERRED EMBODIMENTS

Embodiments of present invention will now be described in detail in conjunction with accompanying drawings.

The simulation method for a tire according to the present invention is a computerized method for evaluating a tire performance.

Figure 1:
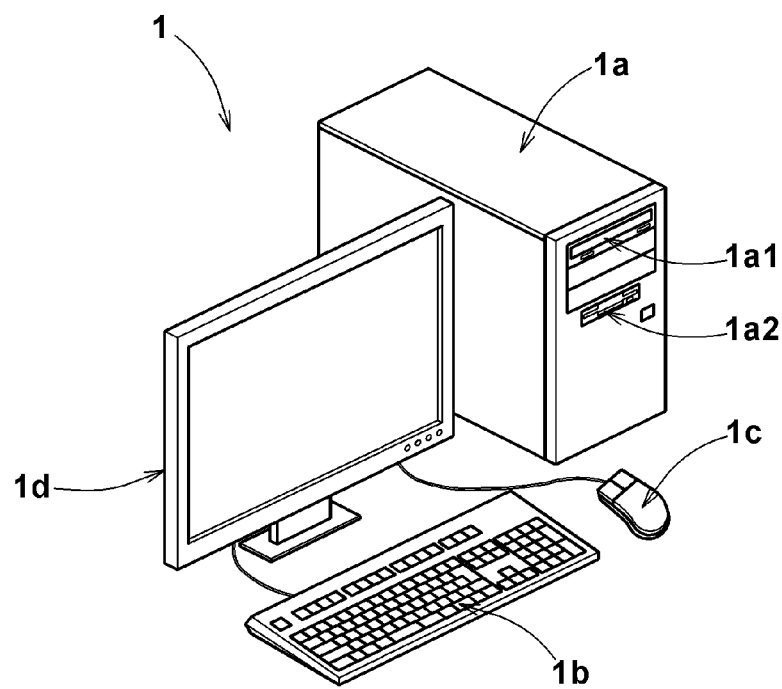
FIG. 1 shows an example of the computer system implementing a simulation method according to the present invention.

As shown in FIG. 1, the computer 1 comprises a main body 1a, a keyboard 1b, a mouse 1c and a display 1d. The main body 1a comprises an arithmetic processing unit (CPU), ROM, work memory, storage devices such as magnetic disk, disk drives 1a1 and 1a2 and the like. In the storage device, programs/software for carrying out a designing method in this embodiment are stored.

Figure 2:
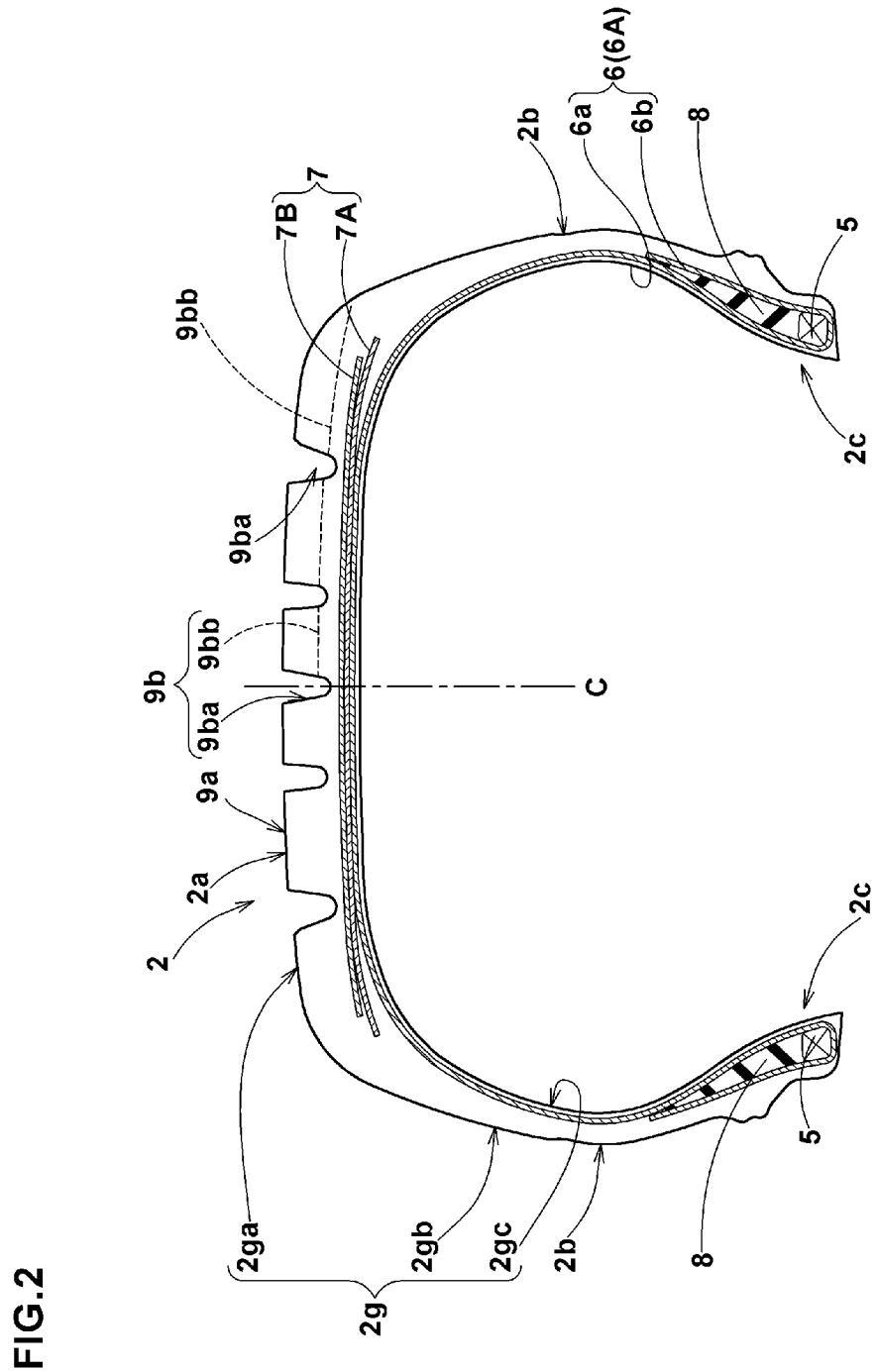
FIG. 2 is a cross sectional view of an example of the tire of which performance is evaluated.

As shown in FIG. 2 for example, the tire 2 is a pneumatic tire comprising a tread portion 2a, a pair of sidewall portions 2b, a pair of bead portions 2c with a bead core 5 therein, a carcass 6 extending between the bead portions through the tread portion and sidewall portions, a belt 7 disposed radially outside the carcass 6 in the tread portion 2a and made up of radially inner and outer belt plies 7A and 7B.

The tread portion 2a is provided in the tread surface 9a with tread grooves 9b. For example, the tread grooves 9b included at least one, in this example, five main grooves 9ba extending continuously in the tire circumferential axial direction, and axial grooves 9bb extending in directions crosswise to the main grooves 9ba.

The carcass 6 in this embodiment consists of one carcass ply 6A. The carcass ply 6A comprises a main portion 6a extending between the bead cores 5 in the bead portions 2c through the tread portion 2a and sidewall portions 2b, and a pair of turnup portions 6b turned up around the bead cores 5 from the axially inside to the outside of the tire.

Between the main portion 6a and each turnup portion 6b, a bead apex rubber 8 is disposed to extend radially outwardly from the bead core 5.

Figure 3:
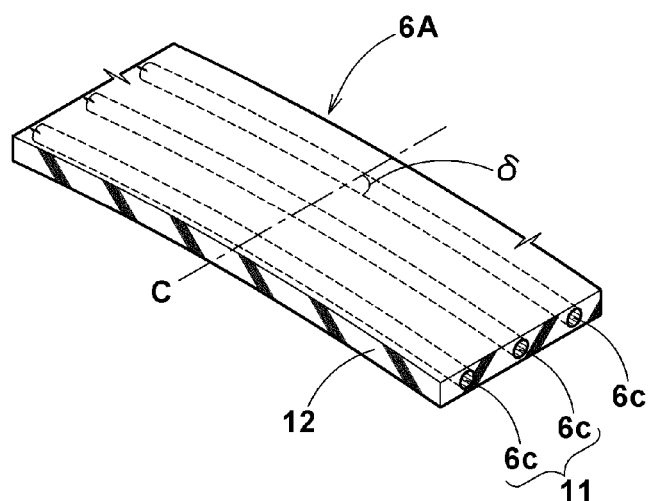
FIG. 3(a) is a partial perspective view of a typical carcass ply.
FIG. 3(b) is a partial perspective view of a typical cross-ply belt.
Figure 3:
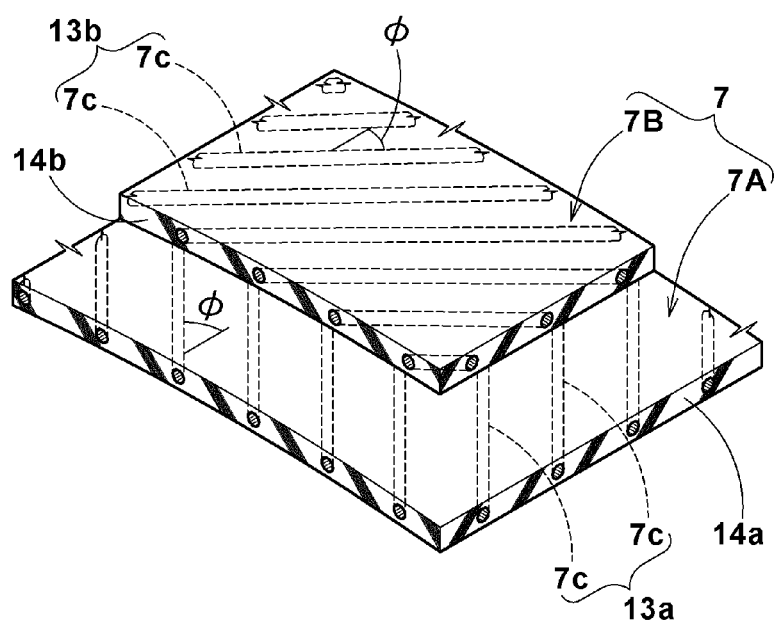

AS shown in FIG. 3(a), the carcass ply 6A is made up of an array 11 of carcass cords 6c arranged at an angle δ of from 65 to 90 degrees with respect to the tire equator C, and a topping rubber 12 covering the cord array 11.

AS shown in FIG. 3(b), the belt ply 7A/7B is made up of an array 13a/13b of belt cords 7c inclined at an angle φ of from 10 to 40 degrees with respect to the tire circumferential direction, and a topping rubber 14a/14b covering the cord array 13a/13b. The belt plies 7A and 7B are arranged so that the belt cords 7c in the belt ply 7A cross the belt cords 7c in the belt ply 7B.

Figure 4:
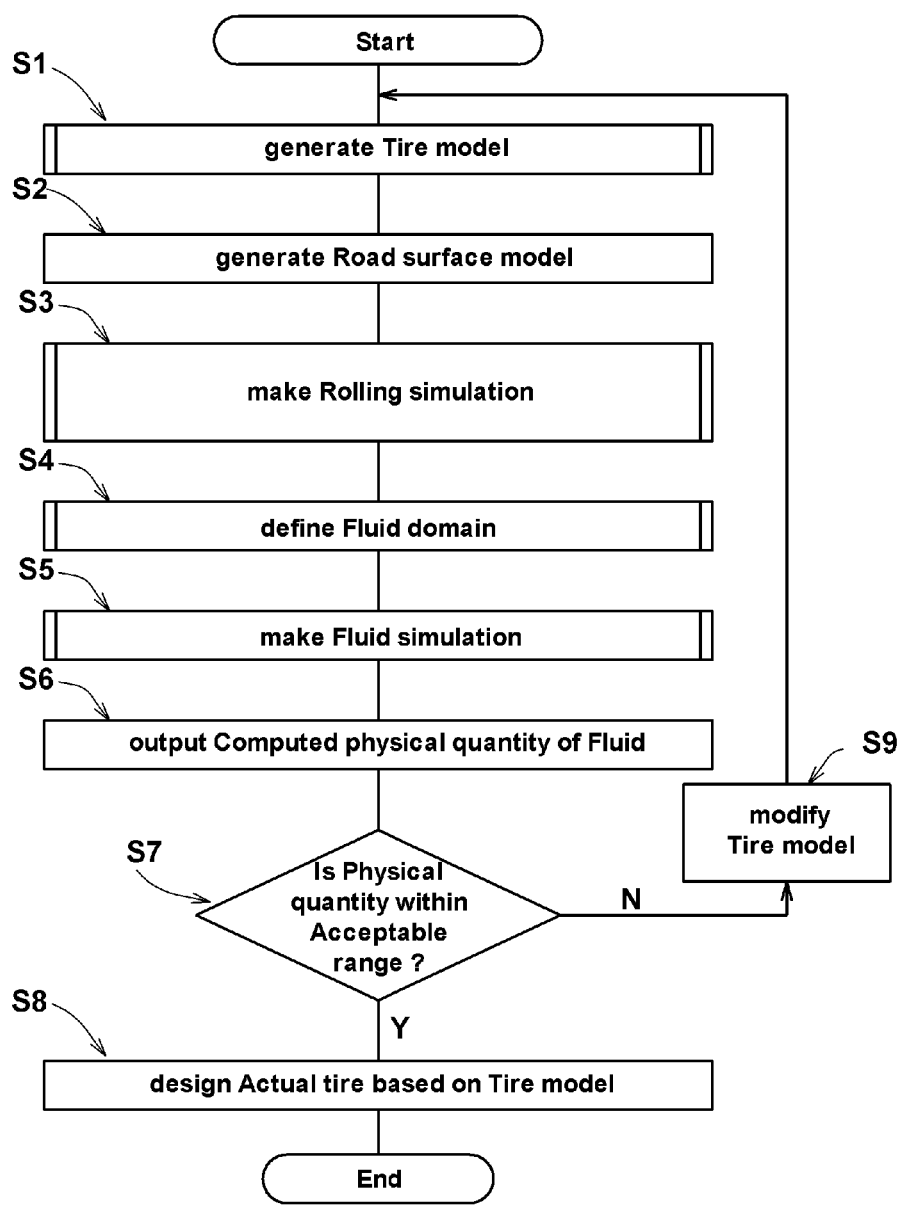
FIG. 4 is a flow chart of the simulation method as an embodiment.

FIG. 4 shows a flowchart of the simulation method as an embodiment of the present invention.

In the simulation method in this embodiment, a tire model 3 which is a finite element model of the tire 2 is generated by the computer 1. (step S1)

Figure 5:
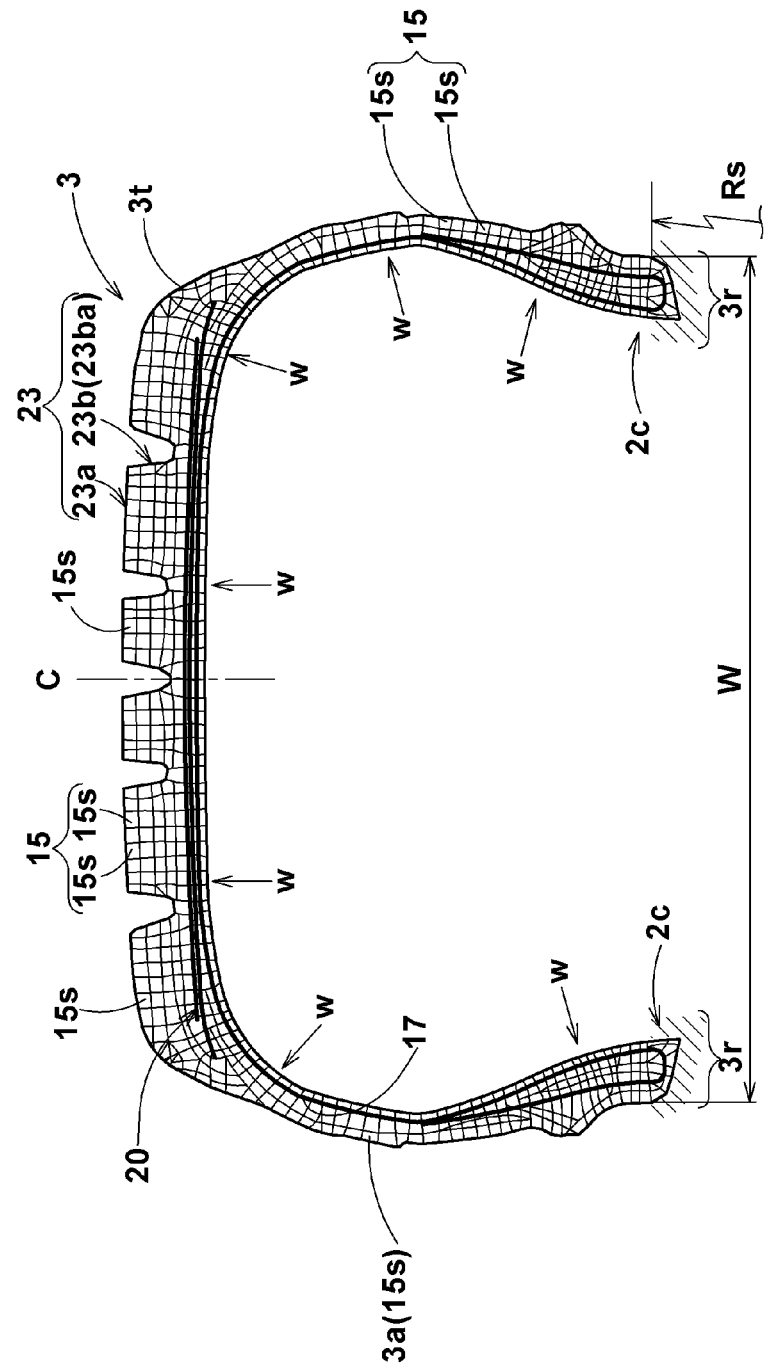
FIG. 5 is a cross sectional view of a tire model of the tire shown in FIG. 2.

The tire 2 is discretized as shown in FIG. 5, and the tire model 3 is made up of a finite number of elements 3a in order to enable numerical analyses.

As to the numerical analysis method, for example, a finite element method, a finite volume method, a finite difference method or a boundary element method may be employed. In this embodiment, a finite element method is employed.

Figure 6:
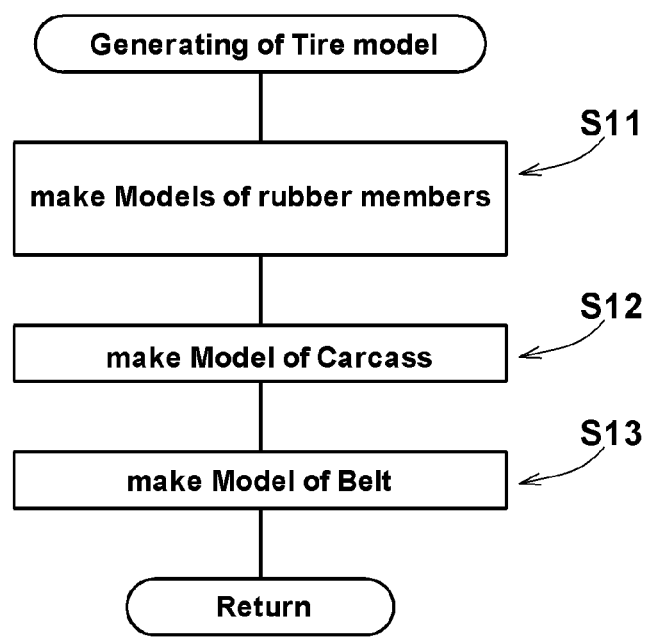
FIG. 6 is a flow chart of generating the tire model.

FIG. 6 shows a flowchart of the step S1 of generating the tire model 3.

In this step S1, the computer 1 generates a model of each of rubber members constituting the tire 2. (step S11) For example, as shown in FIG. 2, the rubber members 2g include a tread rubber 2ga, a sidewall rubber 2gb and an inner liner rubber 2gc.

Figure 7:
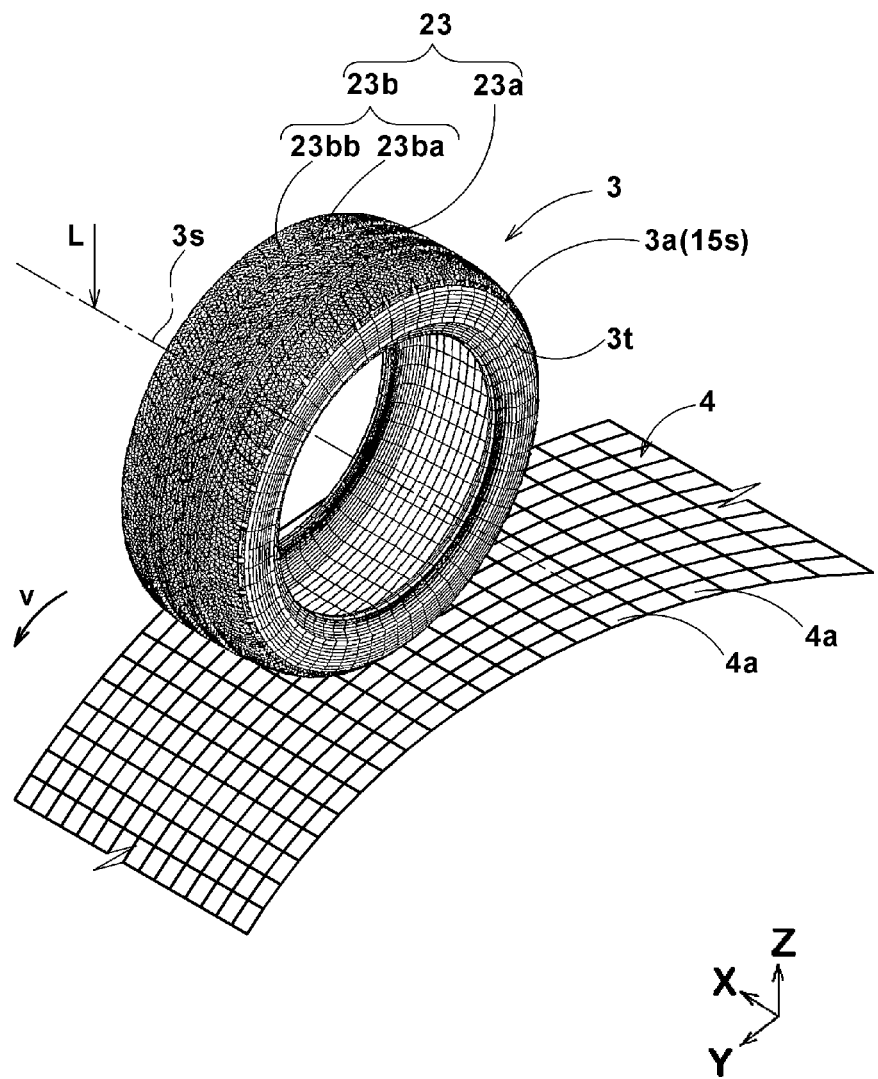
FIG. 7 shows the tire model and road surface model output as a perspective view.

In the step S11, the rubber members 2g are divided into three-dimensional solid elements 15s as shown in FIG. 5. Thus, rubber member models 15 of the rubber members 2g (2ga, 2gb, 2gc - - -) are defined. The tread portion 2a shown in FIG. 2 is divided into the solid elements 15s, and the tread portion 23 having the tread surface 23a and the tread grooves 23b is reproduced in the rubber member models 15. As shown in FIG. 7, the tread grooves 23b include the main grooves 23ba and axial grooves 23bb corresponding to the main grooves 9ba and axial grooves 9bb of the tire 2 shown in FIG. 2.

As to the three-dimensional solid elements 15s, preferred are tetrahedral solid elements suitable for the formation of complicated shapes. In addition, pentahedral solid elements and hexahedral solid elements may be used.

For each of the solid elements 15s, numerical data—for example, an element number, node point numbers, coordinates of the node points in the X-Y-Z coordinate systems, and material characteristics (for example density, Young's modulus and/or damping coefficient and the like)—are defined and stored in the computer 1.

In this embodiment, further, a carcass model 17 of the carcass 6 is generated. (step S12)

Figure 8A:
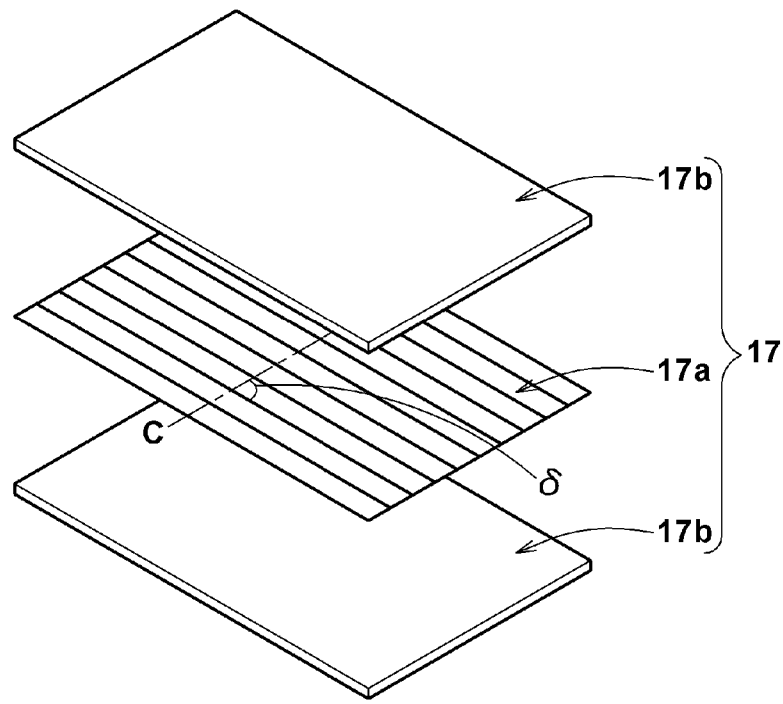
FIG. 8(a) is an exploded perspective view a model of the carcass ply shown in FIG. 3(a) which is made up of shell elements.
Figure 8B:
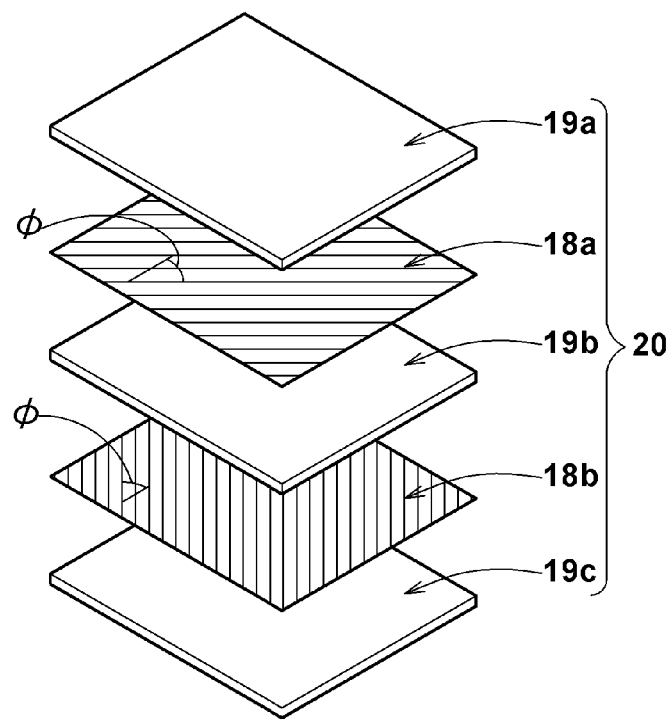
FIG. 8(b) is an exploded perspective view a model of the belt shown in FIG. 3(b) which is made up of shell elements.

In this step S12, as shown in FIG. 3(a) and FIG. 8 (a), the cord array 11 of each carcass ply 6A is modeled by quadrilateral membrane elements 17a, and the topping rubber 12 is modeled by laminar solid elements 17b between which the quadrilateral membrane elements 17a are sandwiched.

Thus, the carcass model 17 in which the membrane elements 17a and the solid elements 17b are alternately laminated in the thickness direction is defined.

On the membrane elements 17a, the diameter of the carcass cords 6c, the inclination angle δ of the carcass cords 6c with respect to the circumferential direction and the like are defined as the anisotropic nature relating to the rigidity.

On the solid elements 17b, super-viscoelasticity where no volume change occurs is defined.

Further, for each element 17a,17b, numerical data for example an element number, the coordinates of the node points and the like are defined and stored in the computer 1.

In this embodiment, further, a belt model 20 of the belt 7 is generated. (Step S13)

In this step S13, as shown in FIG. 3(b) and FIG. 8 (b), the cord array 13a/13b of the belt ply 7A/7B is modeled by membrane elements 18a/18b and the topping rubber 14a and 14b is modeled by solid elements 19a, 19b and 19c.

The belt model 20 in which the membrane elements 18a and 18b and solid elements 19a, 19b and 19c are alternately laminated in the thickness direction is defined.

On the membrane elements 18a and 18b, the diameter of the belt cords 7c, the angle φ of the belt cords 7c with respect to the circumferential direction, and the like are defined as the anisotropic nature relating to the rigidity.

On the solid elements 19a, 19b and 19c, super-viscoelasticity is defined.

Further, for each of the elements 18a, 18b, 19a, 19b and 19c, numerical data for example an element number, the coordinates of the node points and the like are defined and stored in the computer 1.

Through the steps S11 to S13, the tire model 3 shown in FIG. 5 is defined.

Meanwhile, a road surface model 4 of the road surface is generated by the computer 1. (step S2)

The road surface is modeled by a finite number of elements 4a which are rigid surface elements defined as being not deformable. For each element 4a, numerical data for example an element number, the coordinates of the node points and the like are defined and stored in the computer 1.

In this embodiment, as shown in FIG. 7, the road surface is a cylindrical outer surface of a tire test drum.

It is of course possible to use a flat road surface instead of a cylindrical road surface.

In FIG. 7, the road surface model 4 of a smooth road surface is shown. But, if required, in order to simulate the running on an actual road having uneven surface, it is possible to use the road surface model 4 of an uneven road surface for example having small roughness of a well paved asphalt road, irregular steps, dents, roll, wheel ruts or the like.

Next, a rolling simulation step S3 is implemented by the computer 1.

In this step S3, the tire model 3 is brought into contact with the road surface model 4 and a rotation (motion) calculation is made, namely, the state of the tire model 3 rolling on the road surface model 4 under predetermined conditions (rolling velocity v, tire pressure and tire load) is calculated.

Figure 9:
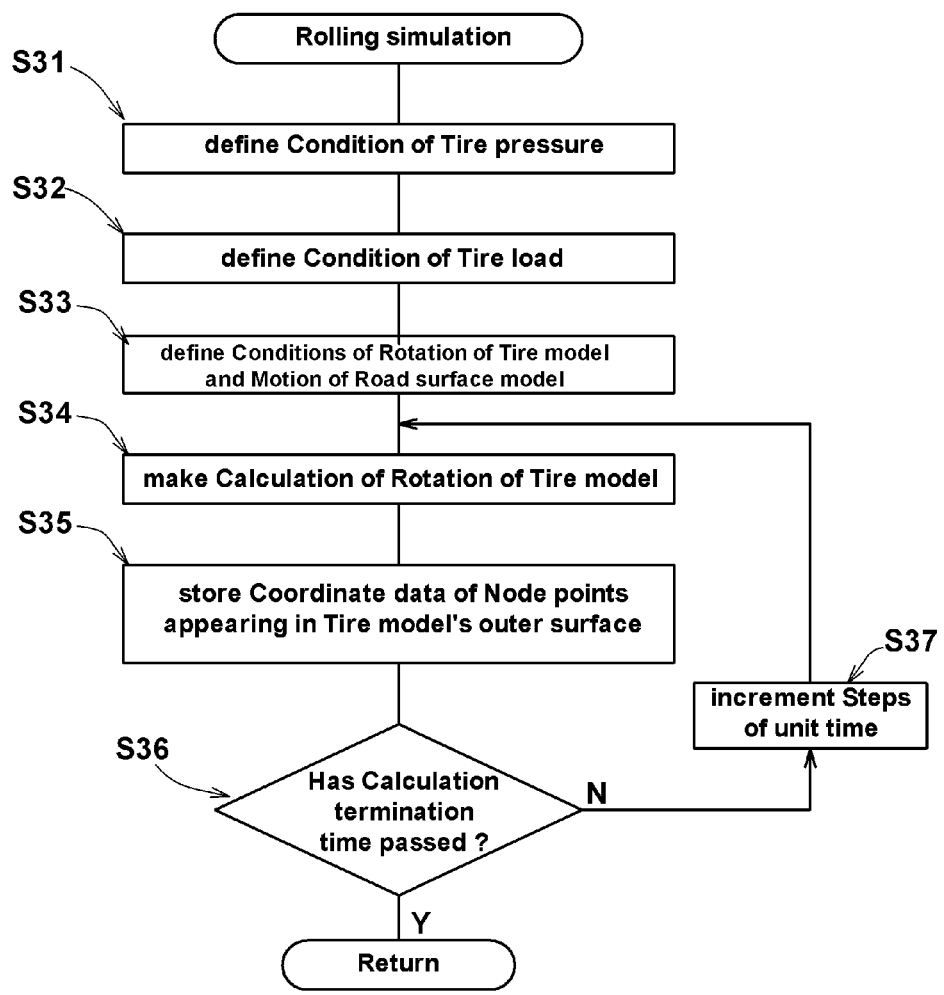
FIG. 9 is a flow chart of a rolling simulation step.

FIG. 9 shows a flowchart of the rolling simulation step S3.

In the rolling simulation step S3 in this embodiment, a condition of the tire pressure is defined on the tire model 3, and a deformation calculation of the tire model 3 is made. (Step S31)

In this deformation calculation, the following conditions are defined: a deformation such that the width w between the bead portions 2c of the tire model 3 becomes equal to the rim width, is imposed on the tire model 3; and the part 3r of the tire model 3 contacting with the wheel rim is defined as being not deformable; and further the radial distance Rs between the rotation axis 3s of the tire model 3 and the above-mentioned rim contacting part 3r becomes always equal to the radius of the wheel rim.

Furthermore, on the inner surface of the tire model 3 facing the tire cavity, a distribution load w corresponding to the tire pressure is defined.

Under such conditions, the computer 1 makes an equilibrium calculation of the tire model 3, therefore, the displacements of the node points due to the tire pressure applied to the inside of the tire model 3 are computed. Thus, the rubber member models 15, carcass model 17 and belt model 20 of the tire model 3 are expanded or stretched, and the tire model 3 after a dilation deformation, namely, an inflated state is simulated.

Next, by defining a condition to apply a tire load to the tire model 3 after the dilation deformation, the computer 1 makes a deformation calculation. (step S32)

In this step S32, as shown in FIG. 7, the tire model 3 is moved relatively toward the road surface model 4 to contact therewith, and a tire load L is applied to the rotation axis 3s of the tire model 3. As to the tire load L, arbitrary values may be used. In this example, the maximum load specified for the tire 2 is applied. Thus, the tire model 3 after the dilation deformation is deformed by the tire load L, and the loaded tire is simulated.

Next, a rotation of the tire and a motion (in this embodiment rotation) of the road surface is defined on the tire model 3 and road surface model 4. (step S33)

In this step S33, an angular velocity corresponding to the rolling velocity v is defined on the tire model 3 and road surface model 4.

Next, based on the rotation (motion) defined on the tire model 3 and road surface model 4, a rotation (motion) calculation of the tire model 3 is made by the computer. (step S34)

In the rotation (motion) calculation, the computer 1 makes the deformation calculation of the tire model 3.

In the deformation calculation, according to the shape, material characteristics and the like of each element, a mass matrix, rigidity matrix and damping matrix of each element are defined, and by combining these matrixes, a matrix of the overall system is defined.

Then, the computer 1 makes motion equations by applying conditions, and the computer 1 makes the deformation calculation of the tire model 3 by calculating the motion equations in steps of a unit time Tx (x=0, 1, - - - ) (for example, 1 microsecond).

When the deformation calculation of the tire model 3 in each step is done, the data on the coordinates, velocity and the like of node points appearing in the outer surface 3t of the tire model 3 are stored in the computer 1. (step S35)

Next, it is judged whether a predetermined calculate termination time has passed or not. (Step S36)

If the calculate termination time has passed, the rolling simulation step S3 is ended.

If the calculate termination time has not passed yet, the steps S34 and S35 are repeated by incrementing the steps of a unit time Tx. (step S37)

Through the step S35, the coordinate data and the like of the tire model 3 from the start to the end of the rolling are stored in the computer 1 as time-series data in steps of a unit time Tx.

Next, a fluid domain 26 surrounding at least a part of the outer surface 3t of the tire model 3 and at least a part of the road surface model 4, is defined in the computer 1. (Step S4) In the fluid domain 26, the fluid is defined.

Figure 10:
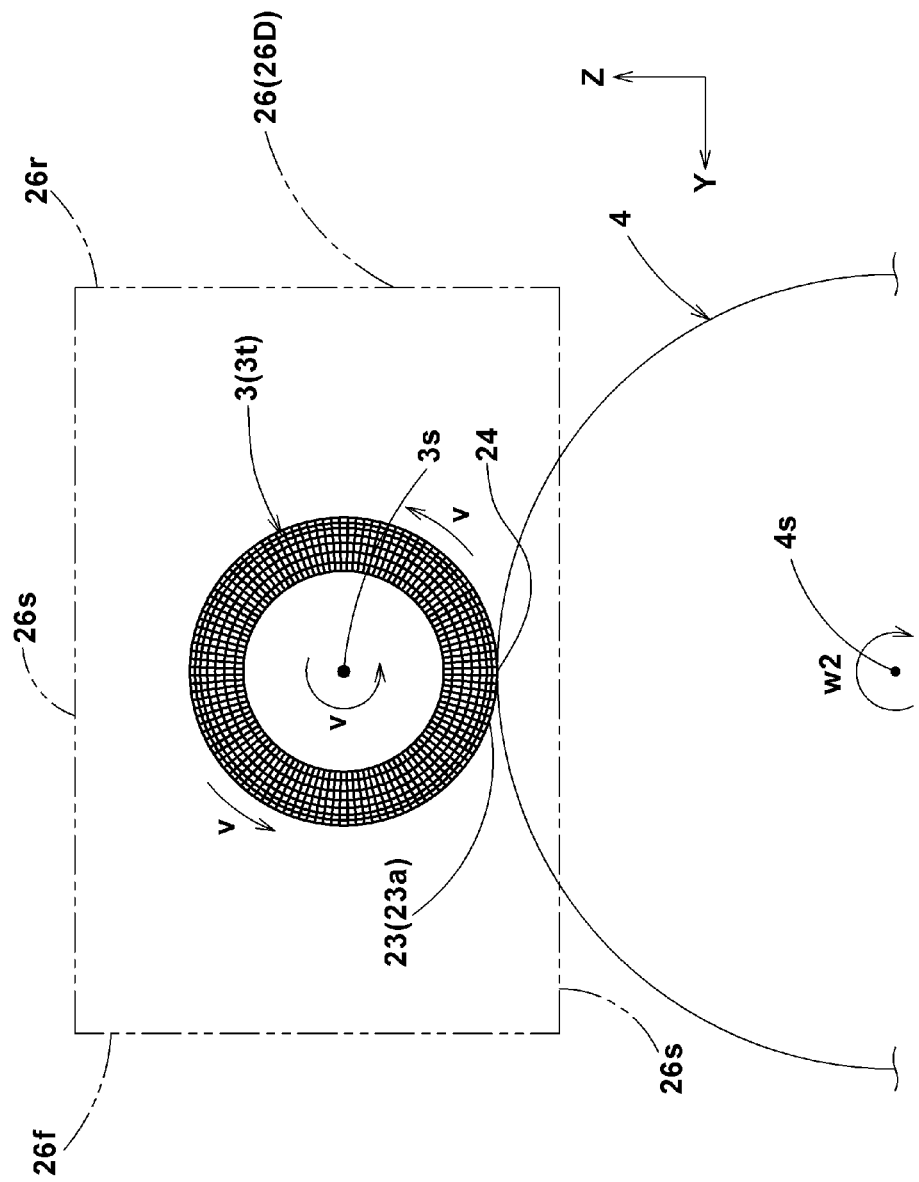
FIG. 10 is a side view corresponding to FIG. 7.

FIG. 10 shows an example of the fluid domain 26.

The fluid may be air, water or the like, therefore, the characteristics of the fluid are defined.

In this example, the fluid is air, therefore, in the fluid domain 26, air flows occur around the tire model 3, and sound is generated. Thus, the noise performance of the tire can be evaluated.

If the fluid is water, drainage performance, aquaplaning performance and the like can be evaluated.

Figure 11:
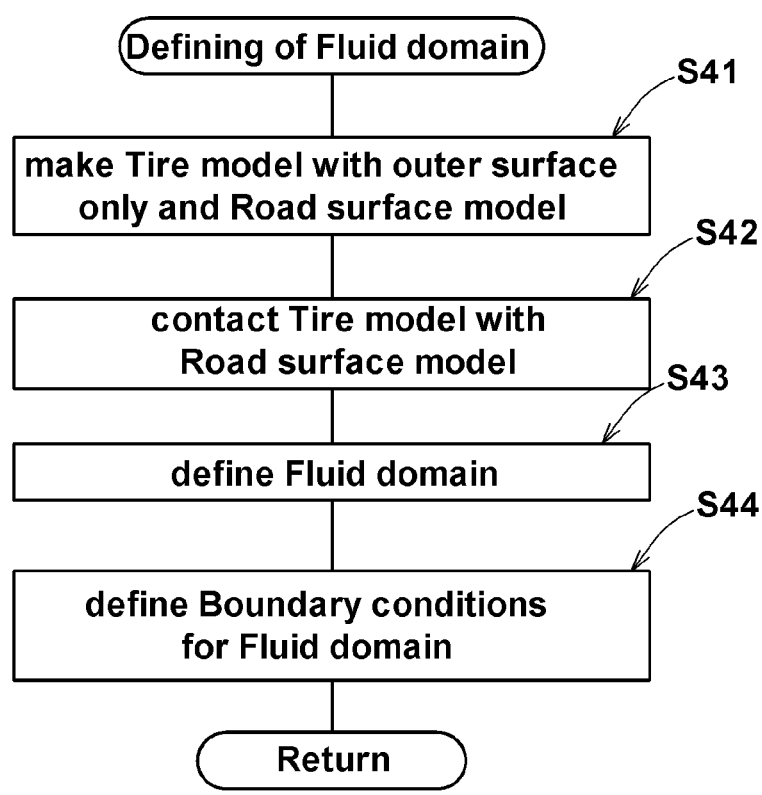
FIG. 11 is a flow chart of a step of defining a fluid domain.

FIG. 11 shows a flowchart of the step S4 of defining the fluid domain 26.

In this step S4, firstly, a tire model 3 shown in FIG. 10, which is different from the tire model 3 shown in FIG. 7 used in the rolling simulation step S3, is generated. (step S41)

In this step S41, only the outer surface 3t of the tire model 3 is defined by the coordinate data (for example, the coordinate data at the start of the rolling (time step=T0)) obtained in the rolling simulation step S3.

In other words, the tire model 3 used in this step is made up of the outer surface 3t only, namely, the above-mentioned node points appearing in the outer surface 3t of the tire model 3, and the elements representing the internal structure of the tire are omitted. Therefore, the data volume of the tire model 3 which has to be dealt with in the fluid simulation is greatly reduced.

On the other hand, the road surface is modeled by a finite number of the elements 4a shown in FIG. 7 in the same manner as in the rolling simulation step S3.

Next, the tire model 3 is brought into contact with the road surface model 4 (step S42), and the fluid domain 26 is defined (step S43).

The fluid domain 26 in this embodiment is a domain in the form of a cube 26D surrounding a part of the tire model 3A and a part of the road surface model 4, from which the volume of the part of the tire model 3A and the volume of the part of the road surface model 4 are removed.

Figure 12:
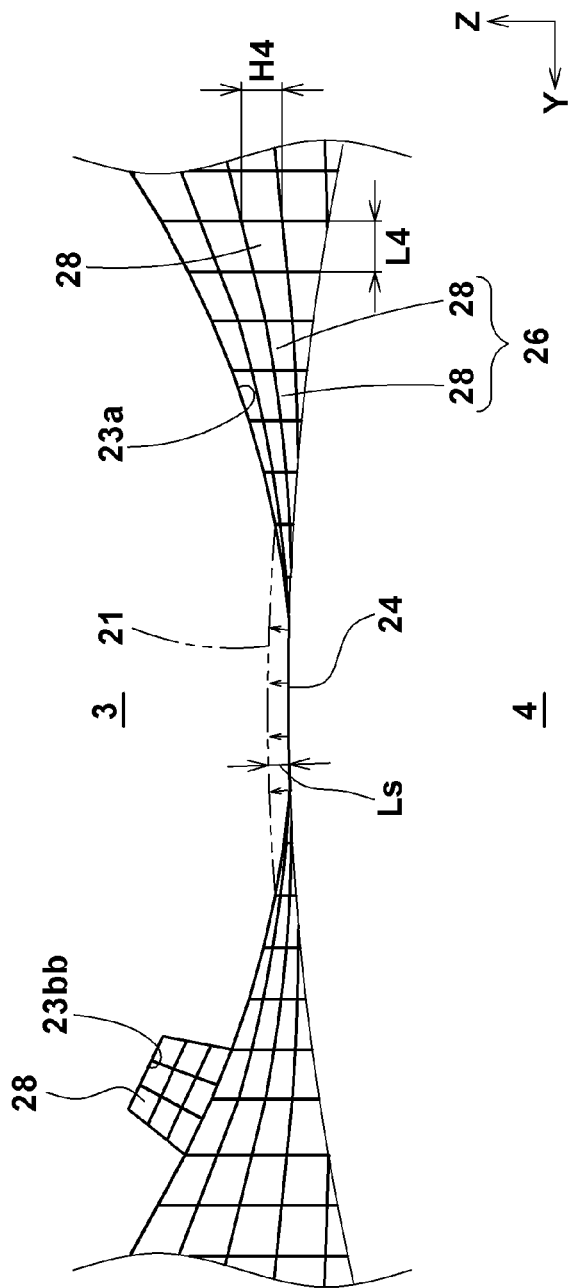
FIG. 12 is a closeup of a part of the side view shown in FIG. 10.

As shown in FIG. 12 which shows a part of the fluid domain 26, the fluid domain 26 is an Euler mesh divided into three dimensional elements 28 (Euler elements). In this embodiment, the elements 28 are heaped in the tire radial direction, tire axial direction and tire circumferential direction. With respect to the node points (or gravity points) of the elements 28, the physical quantities of the fluid is computed.

In the case that the fluid is air and the generated sound is to be evaluated, it is important that the elements 28 have their sizes which can reproduce pressure changes corresponding to noise frequencies. In other words, the sizes of the elements 28 have to be small enough when compared with the shortest wave length. For this reason, it is desirable that the heights H4 of the elements 28 in the tire radial direction are set in a range of from about 0.1 to 2.0 mm.

For the similar reason, the aspect ratio of the element 28 or the ratio of the size L4 in the tire circumferential direction to the size H4 in the tire radial direction is preferably set in a range of not more than 100, more preferably not more than 10, but not less than 0.01, more preferably not less than 0.1.

Next, boundary conditions for the fluid domain 26 are defined. (step S44)

In this step S44, there are defined the boundary surfaces of the fluid domain 26 (the cube 26D) which include, as shown in FIG. 10, a front wall 26f on the front side of the tire model 3A, a back wall 26r on the back side of the tire model 3A, side walls 26s extending between the front wall 26f and back wall 26r, the outer surface 3t of the tire model 3A, and the outer surface of the road surface model 4.

In this embodiment, the front wall 26f, back wall 26r, side walls 26s, the outer surface 3t of the tire model 3A, and the outer surface of the road surface model 4 are defined such that the fluid can not pass therethrough.

However, it is also possible to define the fluid domain 26 such that an inflow of the air having a velocity approximating the rolling velocity v is possible through the front wall 26f, and an outflow of the air is possible through the back wall 26r, whereby more accurate simulation and evaluation of the noise performance of the rolling tire are possible.

In this embodiment, as explained above, the simulation calculation is limited to a relatively narrow domain 26, which also helps to reduce the computational time.

For each of the elements 28 of the fluid domain 26, physical quantities of the fluid (air) such as flow velocity and pressure are defined and stored in the computer 1.

Next, a fluid simulation step S5 is implemented by the computer 1.

In this step S5, the physical quantities of the fluid around the tire model 3 is computed.

Figure 13:
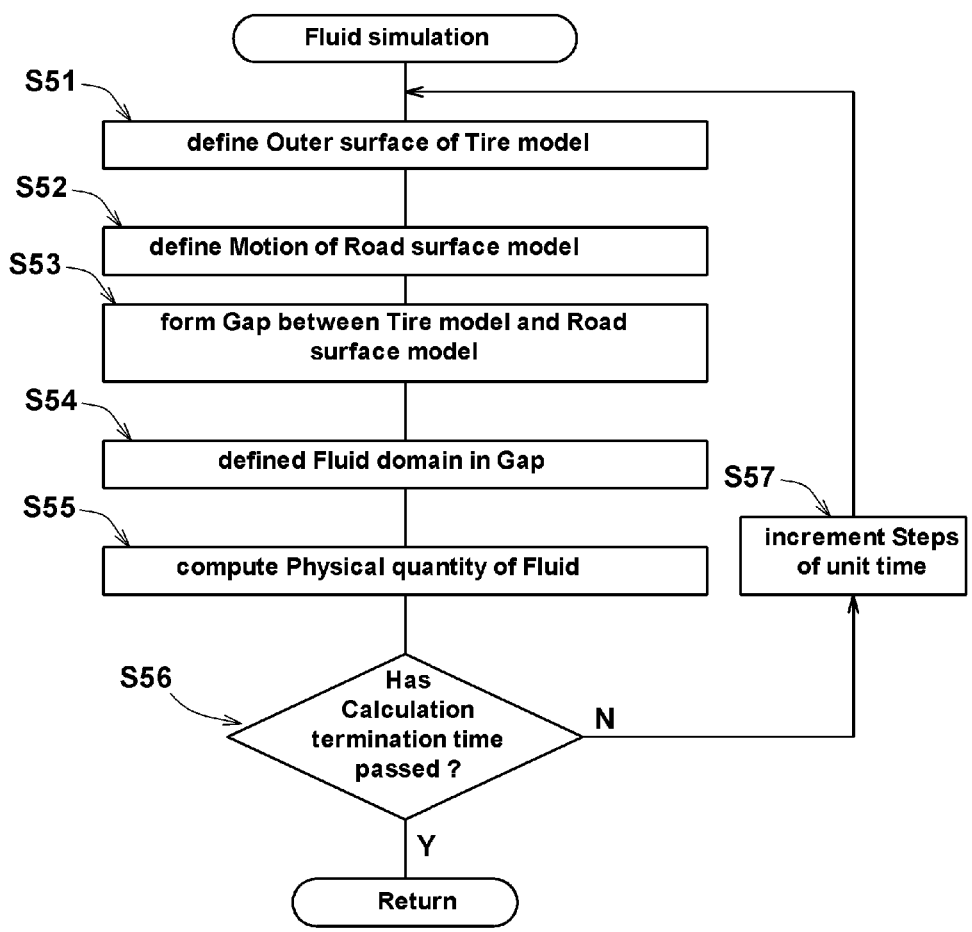
FIG. 13 is a flow chart of a fluid simulation step.

FIG. 13 shows a flowchart of the fluid simulation step S5.

In the fluid simulation step in this embodiment, firstly, the outer surface 3t of the tire model 3 is defined. (step S51)

In this step S51, based on the above-mentioned data stored in the computer 1 as the time-series data in steps of a unit time Tx, the outer surface of the tire model 3 at a given point in time is defined. Thereby, without making the deformation calculation for the tire model 3 as explained above in the rolling simulation step S3, the outer surface 3t of the rotating tire model 3 at any point in time can be easily defined.

Next, a motion (in this embodiment rotation) of the road surface model 4 is defined. (step S52)

On the tire model, its motion is already defined because the tire model is defined based on the above-mentioned time-series data including the motion data at that time. Therefore, in this step S52, as shown in FIG. 10, the angular velocity ω2 corresponding to the tire rolling velocity v is defined on the road surface model 4 only.

Next, at least the ground contacting part 24 of the tread of the tire model 3 is separated from the road surface model 4 by a small distance Ls to form a gap 21 between the tire model 3 and road surface model 4. (step S53)

In this embodiment, as shown in FIG. 12, the ground contacting part 24 of the tread and a part on each side thereof in the tire circumferential direction of the tire model 3 are deformed in the z-axis direction so that these parts and area become parallel with the road surface model 4 and so that the ground contacting part 24 of the tread is separated from the road surface model 4 by the distance Ls.

Figure 14:
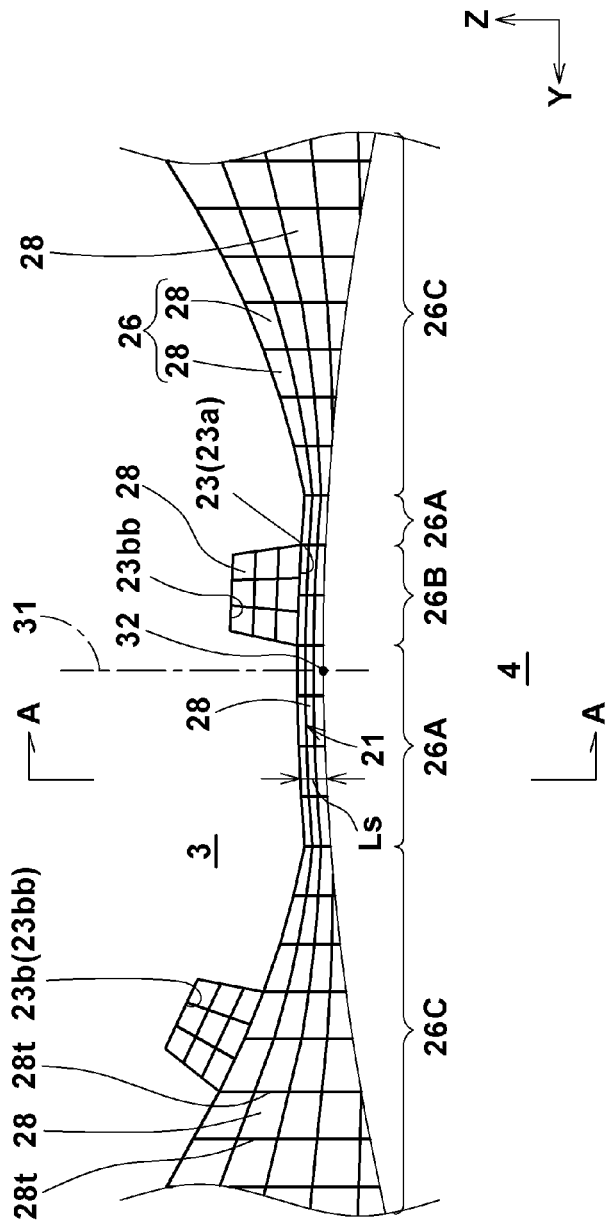
FIG. 14 is an enlarged partial side view corresponding to FIG. 7 for explaining a step of defining the fluid domain in a small gap between the tire model and road surface model.
Figure 15:
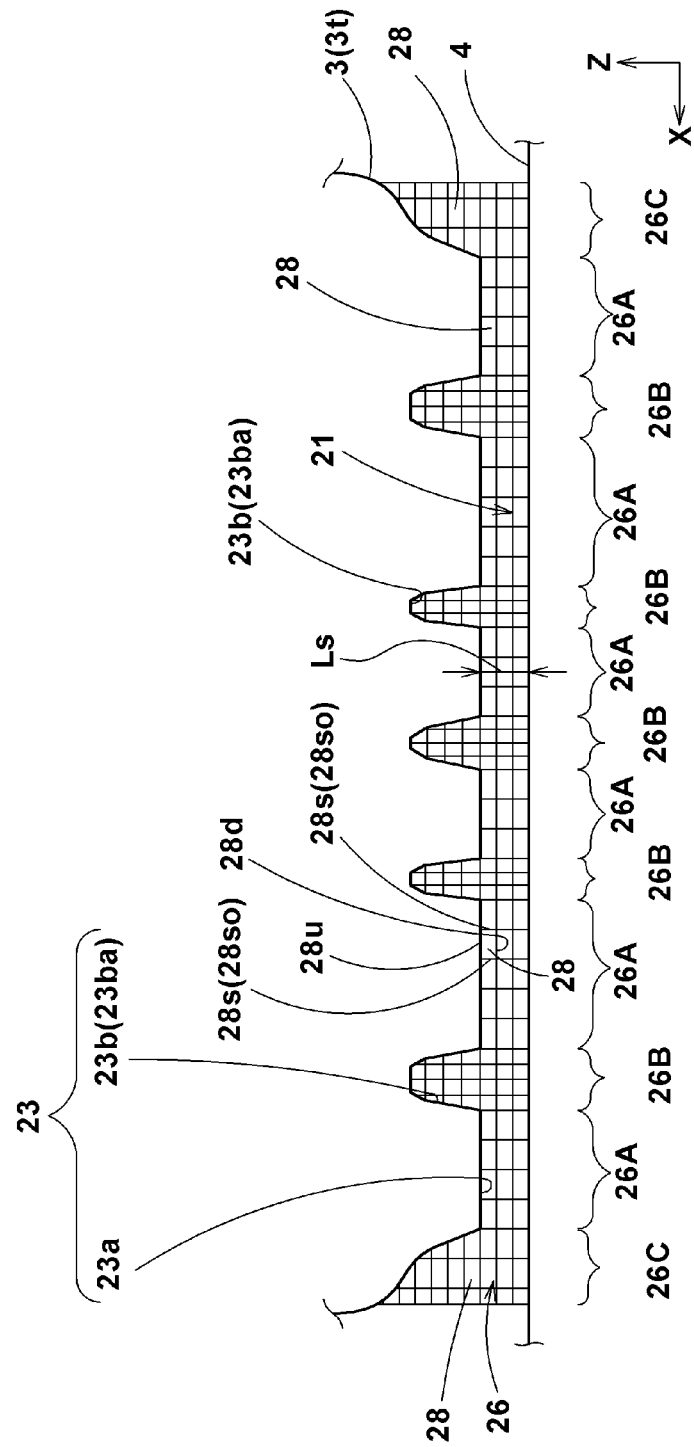
FIG. 15 is a cross sectional view taken along line A-A of FIG. 14.

Thereby, as shown in FIG. 14 and FIG. 15, the gap 21 extends over the entire width of the tread portion 23 of the tire model 3A and the gap 21 is continuous over the circumferential extent of the ground contacting part 24 of the tread.

Such processing can be easily made for example by finding out the node points of the outer surface of the tire model 3 existing within the range of the distance Ls from the road surface model 4 in the z-axis direction and forcibly moving the coordinates of the found node points.

As to the method for forming the gap 21, aside from the above-described method where only a part near the ground contacting surface is deformed, for example, the gap 21 can be formed by shifting the entirety of the outer surface of the tire model 3 in the z-axis direction (up-and-down direction) by a small constant distance Ls.

In this case, however, since the shape of the tire model 3 is changed step by step, there is a possibility that the distance Ls varies outside the predetermined range. Therefore, after the tire model 3 is moved, it is judged whether the distance Ls is within the predetermined range or not. If outside the range, the outer surface of the tire model 3 is shifted so that the distance Ls becomes within the predetermined range.

Next, the fluid domain 26 is also defined in the gap 21. (step S54)

In this embodiment, the fluid domain 26 defined in the gap 21 is constructed by the elements 28 heaped in the tire radial direction in at least two layers.

Thereby, between the road surface model 4 and the tread surface 23a of the tire model 3 which may have different motions, the flow of the elements 28 on the tread surface side and the flow of the elements 28 on the road surface side can be computed independently from each other. Therefore, the computational accuracy of the physical quantities of the fluid can be improved.

In order to effectively bring out such effect, the number of the elements 28 heaped up in the tire radial direction in any position in the gap 21 is at least 2 and preferably at most 10. If the number is more than 10, there is a possibility that the computational time for the physical quantities becomes excessively long. Therefore, the number is more preferably not more than 5 but not less than 3.

For the similar reasons, it is desirable that, when the elements 28 disposed in each of the circumferential grooves 23ba and axial grooves 23bb as shown in FIG. 14 and FIG. 15, are counted in the widthwise direction at any position, the number of the elements 28 is at least 2 and preferably at most 10, more preferably not more than 5 but not less than 3.

As shown in FIG. 14, it is preferable that side faces 28t of each element 28 facing toward the tire circumferential directions are parallel with the z-axis direction. Thereby, each element 28 can keep its shape akin to a rectangular parallelepiped. As a result, it is possible to minimize errors liable to occur when computing physical quantities relating to the deformation and motion by the use of trigonometrical functions. Therefore, the computational accuracy can be improved.

In the fluid domain 26, usually, flows occur mainly in the tire circumferential direction, and flows in the tire axial direction are less. Therefore, as shown in FIG. 15, among the side faces 28s of the elements 28 each extending between the element's outer surface 28u facing toward the tire model 3A and the element's inner surface 28d facing toward the road surface model 4, the side faces 28so facing toward the axially outside are hardly deformed in the tire axial direction.

Accordingly, it is desirable that the both side faces 28so in the axial direction, of each element 28 extend parallel with the tire circumferential direction and orthogonally to the tire model 3A or road surface model 4.

Thereby, with respect to the side faces 28so, the computational accuracy is improved, and it becomes possible to reduce the computational time.

Next, the conditions of the fluid domain 26 are defined and the physical quantities of the fluid are computed. (step S55)

In this step S55, with respect to each of the elements 28 of the fluid domain 26, physical quantities are computed.

In the case that the fluid is air, the motion of the fluid is described by a Navier-stokes equation for example. The Navier-Stokes equation is calculated after converted into an approximate expression, and the motion of air, namely, the pressure, velocity and the like of the elements 28 of the fluid domain 26 are computed.

As to the discretization method for the elements 28 of the fluid domain 26, a finite volume method is used in this embodiment.

The computation of the physical quantities of the fluid (air) can be made by the use of commercially available application software for fluid analysis such as "STAR-CD" of CD-adapco and "FLUNET" of ANSYS, Inc.

In the above-mentioned gap 21, as shown in FIG. 14 and FIG. 15, a ground contacting region 26A between the tread surface 23a of the tire model 3A and the road surface model 4 is very thin in comparison with a grooved region 26B between the groove 23b and the road surface model 4 and a region 26C outside the ground contacting patch. Therefore, the pressure of the fluid necessary for flowing into the ground contacting region 26A becomes relatively high. When the fluid flows into the regions 26A, 26B and 26C, the pressure of the fluid passing through the ground contacting region 26A further increases. Accordingly, the fluid passing through the grooved region 26B and outside region 26C is very hard to enter into the ground contacting region 26A. Therefore, the ground contacting region 26A of the fluid domain 26 where the tire model 3A does not contact with the road surface model 4, functions as a wall shutting off the inflow from the other regions 26B and 26C of the fluid domain 26.

Accordingly, in the present invention, it is possible to compute the physical quantities of the fluid without the need of contacting the tire model 3 with the road surface model 4. Therefore, it becomes not necessary to define the fluid domain 26 by computing the shape and position of the ground contacting part 24 of the tread of the tire model 3 in steps of a minute unit time as in the prior-art method. Thereby, the computational time can be greatly reduced.

In the prior-art method, since the tire model 3 contacts with the road surface model 4, the elements 28 are deformed in a wedge-shape as shown in FIG. 12, and the physical quantities of the fluid have to be computed based on the wedge-shaped elements 28. The wedge-shaped elements, however, make the calculation complex and there is a tendency that the computational errors and computational time are increased.

In contrast, in the method according to the present invention, as shown in FIG. 14 and FIG. 15, since the small gap is formed between the tire model 3A and the road surface model 4, the elements 28 of the fluid domain 26 are not deformed in a wedge-shape, and the deformation calculation becomes less. Therefore, the computational errors and computational time can be reduced.

When the fluid is air, it is preferable that the minimum value of the distance Ls or the small gap is set in a range of not more than 0.1 mm, more preferably not more than 0.075 mm, but not less than 0.01 mm, more preferably not less than 0.025 mm. If less than 0.01 mm, the deformation of the elements 28 in the gap 21 increases and the computational time can not be effectively reduced. If more than 0.1 mm, the increase in the air pressure in the ground contacting region 26A becomes insufficient, and the accuracy of the noise evaluation decreases.

In the step S55 of computing the physical quantities of the fluid, so called resonance noise occurring in the main grooves 9ba of the tire 2 in the ground contacting patch can be simulated by the elements 28 of the fluid domain 26 passing through the main grooves 23ba.

Further, by defining flows and pressure changes on the elements 28 of the fluid domain 26 in the main grooves 23ba and axial grooves 23bb, so called impact noise and pumping noise can be simulated.

In the this embodiment, in order to evaluate the noise performance, the physical quantities of the fluid (air) are computed at one or more predetermined observation points. The observation point may be set at an arbitrary position, for example, near the tread edge or lateral to the tire.

However, if the observation point is too close to the tire model 3A, the pressure changes occurring near the observation point are mainly observed, and it becomes difficult to correctly evaluate the noise performance.

If the observation point is too far from the tire model 3A, since the fluid domain 26 to be computed expands, the computational cost increases. From this standpoint, it is preferable that the observation point is set in a range of not more than 1 m, more preferably not more than 0.5 m from the center 32 of the ground contacting patch as shown in FIG. 14. Here, the center 32 is an intersecting point between the road surface model 4 and a normal line 31 drawn perpendicularly to the road surface model 4 from the rotation axis 3s of the tire model 3A on the tire equatorial plane.

Next, it is judged whether a predetermined calculate termination time has passed or not. (step S56)

If the calculate termination time has passed, then the simulation step S5 is ended, and the computed physical quantities relating to the fluid (in this embodiment, physical quantities relating to noise) are output. (step S6)

If the calculate termination time has not passed yet, then the steps S51 to S56 are repeated by incrementing the steps of a unit time Tx. (Step S57)

Thereby, it is possible to compute the physical quantities of the fluid while rotating the tire model 3 in steps of a minute unit time Tx, from the start to the end of the rolling, without contacting the tire model 3 with the road surface model 4.

Incidentally, the calculate termination time can be arbitrarily defined according to the kind of the simulation made. In this embodiment, the same value as the calculate termination time for the rolling simulation step S3 is defined.

In this embodiment, for example, the change in the air pressure and flow velocity at the observation point, and the air pressure distribution in the fluid domain 26 at arbitrary time are output in the step S6 as the physical quantities.

Next, it is judged whether the physical quantity of the fluid is within an acceptable range or not. (Step S7)

If the physical quantity is within the acceptable range, then the tire 2 is designed according to the tire model 3A, (step S8)

If the physical quantity is outside the acceptable range, then the tire model 3 is modified (step S9), and the simulation is again made (Steps S1 to S7).

In this embodiment, as explained above, the design change for the tire model 3 is continued until the physical quantity becomes within the acceptable range, therefore, the tire having excellent performance can be developed effectively.

Comparison Tests

According to the procedure shown in FIG. 4, a simulation for evaluating noise performance was made, using the tire model shown in FIG. 5. As the result of the simulation, the graph shown in FIG. 16 was output, wherein the air pressure (Pa) obtained at the after-mentioned observation point is shown as a function of the observation time (second).

In this case, the computational time required for the computer to complete the simulation for 0.025 seconds was three days.

Conditions and parameters are as follows:
Tire size: 195/60R15
Circumferential groove: width 7 mm, depth 9 mm
Axial groove: width 5 mm, depth 7 mm
Minimum distance Ls: 0.05 mm
Tire Model:
  number of elements: about 300,000
  division number of tread rubber in the tire circumferential direction: 600
  division number of other rubber members in the tire circumferential direction: 600
Road surface model: cylindrical surface
  circumference: 10 m
Rolling velocity v: 80 km/h
Tire load: 4 kN
Observation point: horizontally 0.24 mm backward from the center 32 shown in FIG. 14

Figure 16:
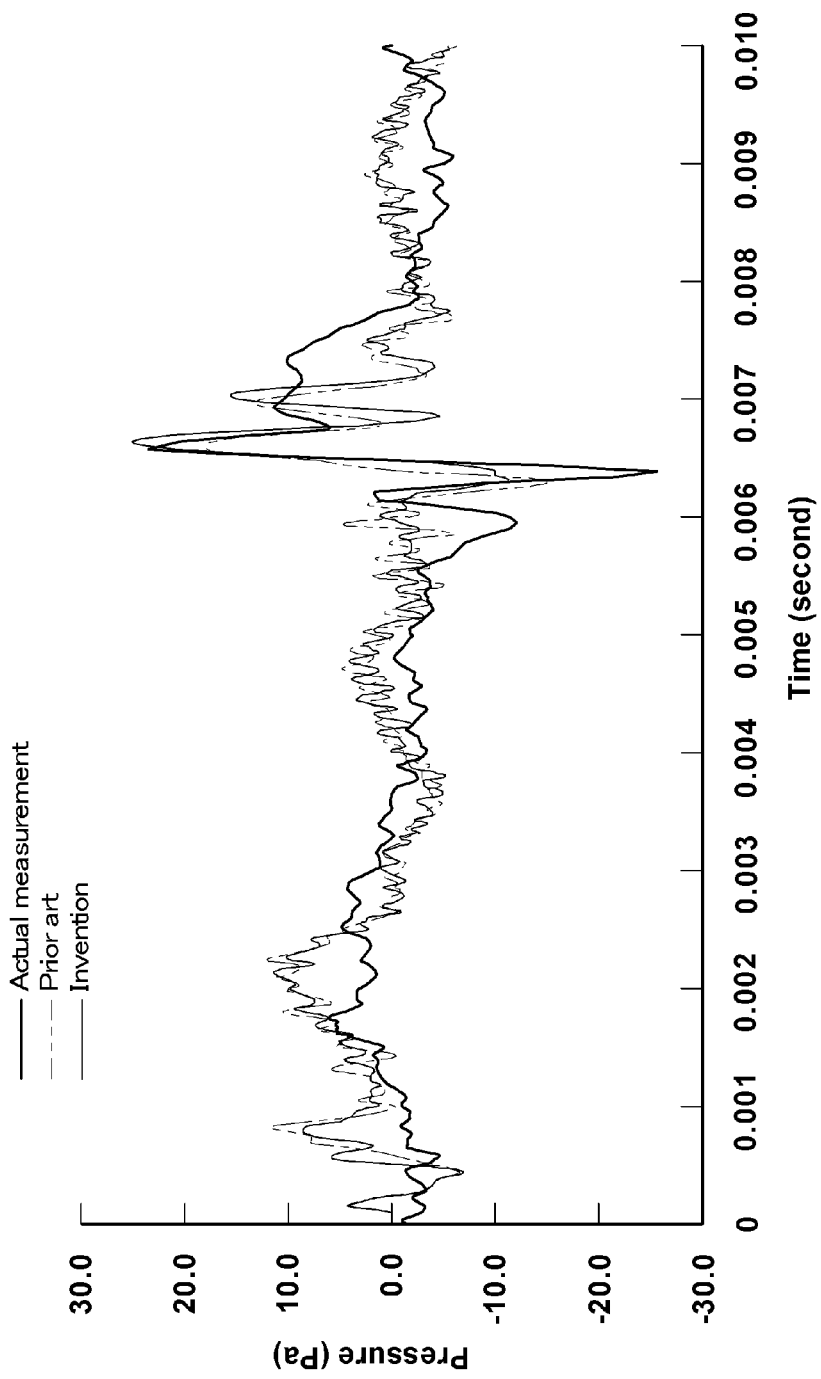
FIG. 16 is a graph showing a simulation result wherein the air pressure change computed at an observation point is shown.

For the comparison purposes, a simulation according to the prior-art method and an actual measurement of the tire noise using the tire and test drum were also conducted. The simulation result and the result of the actual measurement are also shown in FIG. 16.

In the case of the prior-art simulation method, the computational time required for the same computer to complete the simulation for 0.025 seconds was five days.

Therefore, according to the present invention, it is possible to greatly decrease the computational time.

The invention claimed is:

1. A computerized simulation method for evaluating a performance of a tire provided in its tread surface with a groove, comprising:
   defining a first tire model which is a finite element model of the tire, wherein the first tire model has a tread portion provided with the tread surface and the groove;
   defining a road surface model which is a finite element model of a road surface;
   bringing the first tire model into contact with the road surface model so that the outer surface of the first tire model has a ground contacting area;
   computing rotation of the first tire model, wherein a deformation calculation of the first tire model is made by calculation motion equations in steps of time;
   storing chronological data about node points of the first tire model which node points appear in the outer surface of the first tire model during rotating such that, when the deformation calculation of the first tire model in each said step of time is done, the data on coordinates of each of the node points appearing in the outer surface of the first tire model are stored;
   rotating a second tire model defined by only said node points, wherein the second tire model is defined by using said data on the coordinates of said node points obtained in each said step of time and included in said chronological data, whereby the second tire model is rotatable corresponding to the rotation of the first tire model,
   wherein the rotating of the second tire model includes:
     defining a road surface model of said road surface;
     separating the ground contacting area of the outer surface of the second tire model defined for each said step of time from the road surface model so that a small gap extending over the entire width of a tread portion of the second tire model and being continuous over a circumferential extent of the ground contacting area, is formed between the road surface model and the second tire model in each said step of time;
     defining a fluid domain surrounding at least a part of the road surface model and at least a part of the outer surface of the second tire model inclusive of the entire small gap between the road surface model and the second tire model in each said step of time; and
     defining air in the fluid domain;
   computing physical quantities of the air in the fluid domain during the rotation of the second tire model,
   wherein a pressure change of the air is computed to evaluate noise performance of the tire.

2. The simulation method according to claim 1, wherein the small gap is not less than 0.01 mm and not more than 0.1 mm.

3. The simulation method according to claim 2, wherein the fluid domain is divided into a finite number of elements, and the elements in the gap are two or more layers.

4. The simulation method according to claim 3, wherein the elements of the fluid domain each have an aspect ratio of not more than 100, and
   wherein the aspect ratio is a ratio of the size measured in the tire circumferential direction to the size measured in the tire radial direction.

5. The simulation method according to claim 1, wherein the fluid domain is divided into a finite number of elements, and
   wherein the fluid domain defined in the gap is constructed by the elements extending in a tire radial direction in at least two but at most ten layers.

6. A non-transitory computer readable medium comprising a computer simulation program for evaluating a performance of a tire, said tire provided in its tread surface with a groove, the program configured to perform the steps of:
   defining a first tire model which is a finite element model of the tire, wherein the first tire model has a tread portion provided with the tread surface and the groove;
   defining a road surface model which is a finite element model of a road surface;
   bringing the first tire model into contact with the road surface model so that the outer surface of the first tire model has a ground contacting area;
   computing rotation of the first tire model, wherein a deformation calculation of the first tire model is made by calculating motion equations in steps of time;
   storing chronological data about node points of the first tire model which node points appear in the outer surface of the first tire model during rotating such that, when the deformation calculation of the first tire model in each said step of time is done, the data on coordinates of each of the node points appearing in the outer surface of the first tire model are stored;
   rotating a second tire model defined by only said node points, wherein the second tire model is defined by using said data on the coordinates of said node points obtained in each said step of time and included in said chronological data, whereby the second tire model is rotatable corresponding to the rotation of the first tire model,
   wherein the rotating of the second tire model includes:
     defining a road surface model of said road surface;
     separating the ground contacting area of the outer surface of the second tire model defined for each said step of time from the road surface model so that a small gap extending over the entire width of a tread portion of the second tire model and being continuous over a circumferential extent of the ground contacting area, is formed between the road surface model and the second tire model in each said step of time;
     defining a fluid domain surrounding at least a part of the road surface model and at least a part of the outer surface of the second tire model inclusive of the entire small gap between the road surface model and the second tire model in each said step of time; and defining air in the fluid domain;
computing physical quantities of the air in the fluid domain during the rotation of the second tire model,
wherein a pressure change of the air is computed to evaluate noise performance of the tire.

* * * * *